June 5, 1951 B. S. VILKOMERSON 2,555,522
DISCRETE-INTERVAL TUNING SYSTEM AND METHOD
Filed Sept. 27, 1947
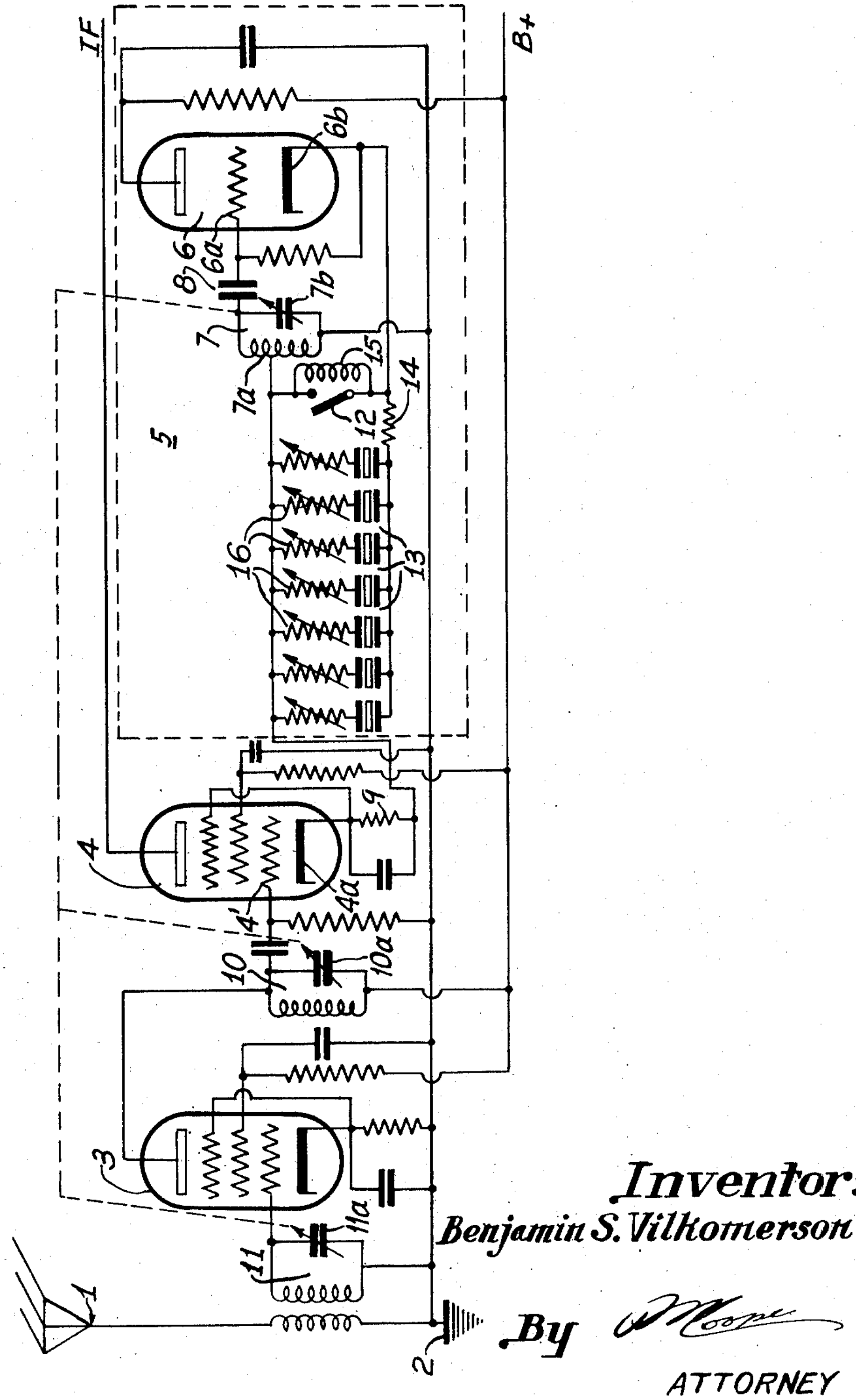
Inventor:
Benjamin S. Vilkomerson
By [signature]
ATTORNEY Patented June 5, 1951 2,555,522

UNITED STATES PATENT OFFICE 2,555,522

DISCRETE-INTERVAL TUNING SYSTEM AND METHOD

Benjamin S. Vilkomerson, Camden, N. J., assignor to Radio Corporation of America, a corporation of Delaware Application September 27, 1947, Serial No. 776,461

3 Claims. (Cl. 250—20)

This invention relates to radio receivers and particularly to radio receivers adapted to receive signals at frequencies determined, in whole or in part, by the frequency of a local oscillator.

In accordance with the invention, usual superheterodyne receiver circuits may be modified to provide two distinct types of tuning with the ordinary tuning control, each type of tuning being especially advantageous under certain conditions of operation.

Long experience has taught that the surest way to receive all radio stations within range is to employ a continuously variable tuning element such as a variable condenser or variable inductance. This is not in all cases the best way, however, because tuning may not be accurately accomplished and signals from inaccurately tuned stations will be distorted. Moreover, precise tuning to strong stations may become unnecessarily laborious because of the high-ratio tuning gear required to tune to weak stations. It is, therefore, desirable that a continuously variable tuning mechanism be available when numerous stations are to be received, but for receiving a few selected stations best results can be obtained by tuning in discrete frequency steps instead of continuously, one such step being provided for each station to be received. With such discrete-interval tuning, it can be assured that, if a signal from a transmitting station is tuned in at all, the tuning will be accomplished properly and with a minimum of effort.

Tuning in discrete steps has heretofore been accomplished by such methods as push-button tuning and detent tuning. The former has been objectionable, as compared with my present invention, in that it is unduly complicated mechanically, requiring a number of switches so arranged that the operation of one renders inoperative all the rest in order that only one transmitting station may be received at a time, and the problem of providing for changing from continuous to discrete-interval tuning has been relatively difficult. Furthermore, in some arrangements, the sensitivity of the receiver has been impaired with push button tuning, whereas in accordance with the invention the performance of the receiver is in no way impaired with either continuous or discrete-interval tuning. Tuning with detent type mechanism has involved mechanical problems not present in my arrangement and has been subject to inaccuracy due to thermal drift, that is, change with temperature of the frequency of the local oscillator, an effect that is largely eliminated by the use of crystals in accordance with the invention.

In accordance with my invention, tuning in discrete steps is accomplished automatically by providing a plurality of crystals associated with a local oscillator circuit employing the usual tuning means. When the usual circuit is tuned near the frequency of a particular crystal, the oscillator functions at that crystal frequency to make possible the reception of signals of a frequency with which that particular crystal is identified. This is accomplished by the oscillations from the oscillator beating with the received signal to produce a signal of the frequency to which the intermediate-frequency circuits are tuned. When the circuit is tuned near the frequency of a different crystal, the oscillator functions at a different frequency to make possible the reception of signals transmitted on a correspondingly different frequency. As many crystals may be provided as desired, one for each transmitting station to be received. When continuous tuning is desired, it is only necessary to close a simple switch, whereupon the system operates continuously, exactly as it would without the crystals.

Crystal-controlled oscillators, of course, are not new, nor are receiving circuits employing local oscillators new, but it appears to be new to provide the combination with such circuits of a multicrystal-controlled oscillator having a continuously variable tuning circuit for selecting particular crystals. Furthermore, although the crystals may be applied to various types of well-known oscillator circuits, these circuits have been modified, as described more fully hereinafter, to make them more useful in combinations embodying the invention.

It is important to note that, in accordance with the invention, exact tuning of the receiver is accomplished with only approximately correct tuning of the usual continuously variable circuit, because the local oscillator will function at the crystal frequency when the continuously variable circuit is tuned anywhere within a small frequency interval on either side of the crystal frequency, the extent of the interval being adjustable as described hereinafter. Another important advantage of the invention is that the oscillator does not function, and hence no noise or undesired stations are received, when the continuously variable tuning control is set anywhere between the above-mentioned intervals.

The principal object of the invention is to achieve automatic discrete-interval tuning of a radio receiver by continuously varying the tuning of its local oscillator. A plurality of crystals associated with the local oscillator accomplishes this purpose when operated as described herein.

A further object of the invention is to provide a radio receiver wherein a single knob, or like tuning means, may be utilized for either continuous or discrete-interval tuning. This object is accomplished by providing a simple switch for short-circuiting the crystals that otherwise would produce automatic discrete-interval tuning.

The accompanying drawing is a circuit diagram of a radio receiver embodying the invention.

An incoming signal produces a voltage between antenna 1 and ground 2 which is amplified in the usual way by amplifier tube 3 and applied to control grid 4′ of mixer tube 4 where it is combined with a signal from local oscillator 5 to produce in the plate circuit of mixer tube 4 a signal at an intermediate frequency which may be applied to any well-known intermediate-frequency amplifier and utilization circuit, not shown. Mixer tube 4 and oscillator 5 may be combined, if desired, in accordance with well-known practice to form an oscillating detector or converter. Local oscillator 5 may be of any well-known type in which piezoelectric crystals may be interposed in such a way that oscillation will occur at the resonant frequency of a crystal when the crystal is suitably conditioned, that is, when the oscillator tuning circuit 7 is tuned approximately to the crystal frequency, but in such a way that no oscillation will occur except at the resonant frequency of a tuned crystal. This condition will be fulfilled if the crystals are connected in parallel and if the crystal assembly is connected in any of numerous places in the circuit in which low impedance is a necessary condition for oscillation.

The piezoelectric crystals may, if desired, be of the well-known plug-in form, each being dimensioned to mechanically resonate at the predetermined frequency necessary for reception of signals from a particular transmitting station. Oscillators employing such crystals are well known to those skilled in the art and therefore need not be described here in detail. By way of example, local oscillator 5 may comprise vacuum tube 6 having tuning circuit 7 connected at one end through condenser 8 to grid 6*a* of this tube, and at the other end to ground 2, with a suitably positioned tap on inductance member 7*a* of circuit 7 connected to cathode 4*a* of tube 4 through bias resistor 9 and to cathode 6*b* of tube 6 through switch 12 or crystals 13. Variable condenser 7*b* of circuit 7 may be connected mechanically to variable condensers 10*a* and 11*a* of radio-frequency circuits 10 and 11 to tune the radio-frequency circuits to the desired incoming signal while tuning oscillator circuit 7 to a frequency differing therefrom by the intermediate frequency of the receiver, all in a well-known manner. With switch 12 closed, the circuit thus far described operates as an ordinary superheterodyne receiver.

In accordance with the invention, when switch 12 is open piezoelectric crystals 13 are interposed in the oscillator circuit in such a way that oscillation will occur at the resonant frequency of the one of the crystals to which frequency circuit 7 is approximately tuned and at which frequency the impedance of the crystal is low, but no oscillation will occur at other frequencies where the impedance of the crystal assembly is so high as effectively to separate at radio frequencies cathode 6*b* of tube 6 from the rest of the circuit. It will be understood, of course, that the expression "at the resonant frequency of the crystal," as used herein, includes a narrow band of frequencies due to variation in temperature of the crystal or to the effect on it of certain extraneous circuit elements, but that such band of frequencies will be so narrow as to be of minor importance in the operation of the circuit described herein.

It is well known that a crystal-controlled oscillator will oscillate at a substantially constant predetermined frequency, known as the frequency of the crystal, but that this frequency may vary slightly due to changes in the temperature of the crystal or changes in the impedance of the external circuit. Despite these minor frequency variations, it is considered that a receiver tuned by one of the crystals 13 will be exactly tuned since any departure from the correct frequency of the crystal will be very small compared to the departure from the correct oscillator frequency that is likely to occur with hand tuning of a continuously variable circuit.

Resistor 14, which usually may be of the order of 500 or 600 ohms, is interposed in series with crystals 13 for the purpose of increasing their impedance and thus narrowing the range of frequencies within which circuit 7 will cause oscillation of oscillator 5 at the frequency of one of the crystals. Without resistor 14, or with a low value thereof, the oscillator would function over a rather wide band of frequencies at each crystal frequency, because the crystal impedance would be sufficiently low to permit oscillation over such band; and, if these bands were to overlap, the oscillator frequency might correspond to the frequency of either of two crystals and thus the calibration of the receiver would be ambiguous. Resistor 14 may be of suitable magnitude to prevent overlapping of the bands by preventing oscillation of oscillator 5 except when circuit 7 is tuned close to the resonant frequency of one of the crystals 13. Resistor 14 should not be so large, however, as to require exact tuning of circuit 7 to a crystal frequency in order for the oscillator to function, since tuning the receiver would then be difficult and the full advantage of the invention would not be realized. If desired, the widths of the above-mentioned bands may be adjusted individually by adjusting resistors 16.

Inasmuch as the frequency of oscillator 5 determines the intermediate frequency for each received signal, and since the intermediate-frequency amplifier is ordinarily much more sharply tuned than are radio-frequency circuits 10 and 11, the tuning of the receiver is controlled for the most part by the tuning of oscillator 5. Thus, with the circuit described, in which it is necessary manually to tune oscillator 5 only approximately to a particular frequency in order to receive a desired station, it will not be necessary to tune radio-frequency circuits 10 and 11 more accurately, and the tuning of the receiver as a whole to any station identified with one of the crystals 13 readily will be accomplished.

When it is desired to use the receiver in the ordinary way, with continuously variable tuning, switch 12 will be closed. When discrete-interval tuning is desired, switch 12 is opened and the usual tuning control for circuits 7, 10, and 11 is operated as it would be with continuously variable tuning. The results achieved by such tuning, however, are quite different since a station will be exactly tuned whenever circuit 7 is approximately tuned to the frequency of one of crystals 13, but no noise or undesired signals will be heard at intermediate positions of the tuning control since oscillator 5 will be inoperative at such intermediate positions, and operation of oscillator 5 is necessary for a signal to pass through the receiver.

Radio-frequency choke coil 15 is shunted around switch 12 to provide a path for direct currents when the switch is open. It is contemplated that this choke coil will be of so high impedance that it will not affect the operation of crystals 13.

It will be understood that the invention is not limited to the precise form depicted herein as an example, but that it includes modifications thereof within the scope of the following claims.

What I claim is:

1. In a tunable radio receiving system employing mixer means for heterodyning incoming signals with oscillations from a local oscillator, a local oscillator circuit comprising in combination a variably tunable frequency selective means, an oscillatory circuit, a portion of which includes an oscillation controlling path which permits oscillation only when the impedance of the path is low, switch means having open and closed positions connected serially in said path, said switch means when in the closed position providing a low impedance in said path thereby to establish said condition for oscillation of said oscillator circuit at a frequency determined by said variably tunable frequency selective means, and a plurality of electrically resonant elements having low resonant impedances at different predetermined frequencies, and a circuit connecting said resonant elements in parallel with said switch means whereby said elements provide a plurality of low impedance connections in said path in shunt with said switch means at discrete frequency intervals in the said path in shunt with said switch means and thereby provides for operation of said oscillator circuit when said switch means is in the open position as said frequency selective means is simultaneously tuned to approximately the resonant frequency of each of said elements, and for further operation of said oscillator circuit when said switch means is closed for continuously variable frequency control by said frequency selective means alone.

2. A system as defined in claim 1 wherein a plurality of separately variable resistances are provided, each resistance being serially connected with one of said resonant elements whereby variation of said resistance varies the band width of frequency bands associated with said electrically resonant elements.

3. In a signal receiving system of the heterodyne type, a local oscillator circuit including an electronic tube having a grid, a cathode and an anode, a variably-tunable parallel-resonant circuit connected between said grid and said anode, a cathode circuit for said oscillator connected between an intermediate point on said resonant circuit and said cathode, said cathode circuit comprising a plurality of parallel connected elements having different low impedance values at different predetermined frequencies whereby tuning of said parallel resonant circuit to approximately the predetermined frequency of said elements permits oscillations at the said predetermined frequency and switch means connected in parallel with all the said elements to provide low impedance in the cathode circuit at all tunable frequencies thereby to provide oscillations at frequencies dependent upon said variably tunable circuit alone.

BENJAMIN S. VILKOMERSON.

REFERENCES CITED

The following references are of record in the file of this patent:

UNITED STATES PATENTS

| Number | Name | Date |
|---|---|---|
| 1,578,296 | Taylor | Mar. 30, 1926 |
| 1,830,322 | Hund | Nov. 3, 1931 |
| 1,994,658 | Marrison | Mar. 19, 1935 |
| 2,017,712 | Downey | Oct. 15, 1935 |
| 2,067,081 | Goldstine | Jan. 5, 1937 |
| 2,215,775 | Banfield | Sept. 24, 1940 |
| 2,323,924 | Mayer | July 13, 1943 |